United States Patent
Satoh et al.

(10) Patent No.: US 11,108,340 B2
(45) Date of Patent: Aug. 31, 2021

(54) PIEZOELECTRIC ACTUATOR HAVING SEPARATE FRICTIONAL PORTIONS

(71) Applicant: TDK CORPORATION, Tokyo (JP)

(72) Inventors: Yasuyuki Satoh, Tokyo (JP); Katsumi Yamauchi, Honjo (JP); Katsuya Inaba, Tokyo (JP); Yoko Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 632 days.

(21) Appl. No.: 15/884,785

(22) Filed: Jan. 31, 2018

(65) Prior Publication Data

US 2018/0219494 A1 Aug. 2, 2018

(30) Foreign Application Priority Data

Feb. 1, 2017 (JP) .............................. JP2017-016941

(51) Int. Cl.
*H02N 2/00* (2006.01)
*H01L 41/047* (2006.01)
*H01L 41/083* (2006.01)
*H01L 41/293* (2013.01)

(52) U.S. Cl.
CPC ......... *H02N 2/0015* (2013.01); *H01L 41/047* (2013.01); *H01L 41/0471* (2013.01); *H01L 41/0472* (2013.01); *H01L 41/083* (2013.01); *H01L 41/293* (2013.01)

(58) Field of Classification Search
CPC . H02N 2/0015; H01L 41/047; H01L 41/0471; H01L 41/0472; H01L 41/083; H01L 41/293

USPC ................................................... 310/323.16
See application file for complete search history.

(56) References Cited

U.S. PATENT DOCUMENTS

| | | |
|---|---|---|
| 2005/0062367 A1 | 3/2005 | Funakubo et al. |
| 2007/0236107 A1* | 10/2007 | Maruyama ............ H01L 41/083 310/366 |
| 2011/0156536 A1 | 6/2011 | Adachi |

FOREIGN PATENT DOCUMENTS

| | | |
|---|---|---|
| JP | S63-277477 A | 11/1988 |
| JP | H07-327379 A | 12/1995 |
| JP | 2005-094956 A | 4/2005 |
| JP | 2011-135711 A | 7/2011 |

* cited by examiner

*Primary Examiner* — Shawki S Ismail
*Assistant Examiner* — Monica Mata
(74) *Attorney, Agent, or Firm* — Oliff PLC (57) ABSTRACT

A piezoelectric actuator (1) includes: a piezoelectric element (3); and a first frictional portion (10) and a second frictional portion (12) that are disposed on one principal surface (2*d*) of the piezoelectric element (3). The first frictional portion (10) is disposed at a position other than the antinodes of the piezoelectric element (3) at which a distance from one of the end surfaces (2*a*) is less than ⅓ L, where L represents a length in the longitudinal direction of the piezoelectric element (3). The second frictional portion (12) is disposed at a position other than the antinodes of the piezoelectric element (3) at which a distance from the other of the end surfaces (2*b*) is less than ⅓ L.

2 Claims, 6 Drawing Sheets

Fig.6B

PIEZOELECTRIC ACTUATOR HAVING SEPARATE FRICTIONAL PORTIONS

The invention relates to a piezoelectric actuator.

BACKGROUND

An example of a piezoelectric actuator according to the related art is disclosed in Japanese Unexamined Patent Publication No. 2005-94956. The piezoelectric actuator described in Japanese Unexamined Patent Publication No. 2005-94956 causes a frictional portion to generate ultrasonic elliptical vibration by generating a vibration mode in which a longitudinal vibration mode and a bending vibration mode are combined in a piezoelectric element. In the piezoelectric actuator, the frictional portion is disposed at a position corresponding to an antinode of bending vibration.

SUMMARY

In the piezoelectric actuator according to the related art, as described above, the frictional portion is disposed at an antinode (generally a ⅓ position in a longitudinal direction of the piezoelectric element) having a maximum amplitude in bending vibration of the piezoelectric element. In such a piezoelectric actuator, there is demand for further improvements in driving characteristics.

An object of an aspect of the invention is to provide a piezoelectric actuator that can achieve an improvement in driving characteristics.

According to an aspect of the invention, there is provided a piezoelectric actuator including: a piezoelectric element that is formed by stacking a plurality of piezoelectric material layers includes a pair of principal surfaces having rectangular shapes and facing each other, a pair of end surfaces facing each other in a long-side direction of the pair of principal surfaces, and a pair of lateral surfaces facing each other in a short-side direction of the pair of principal surfaces, and generates a vibration mode in which a longitudinal vibration mode and a bending vibration mode are combined in response to an applied voltage; and a first frictional portion and a second frictional portion that are disposed on one of the principal surfaces of the piezoelectric element and come into contact with a driven object to generate a frictional force with the driven object, wherein the piezoelectric element includes antinodes having maximum amplitude in the bending vibration mode at positions which are asymmetric with respect to a straight line passing through a center in a longitudinal direction of the piezoelectric element and parallel to the facing direction of the pair of principal surfaces when viewed in the facing direction of the pair of lateral surfaces, the first frictional portion is disposed at a position other than the antinodes of the piezoelectric element at which a distance from one of the end surfaces is less than ⅓ L, where L represents a length in the longitudinal direction of the piezoelectric element, and the second frictional portion is disposed at a position other than the antinodes of the piezoelectric element at which a distance from the other of the end surfaces is less than ⅓ L.

In the piezoelectric actuator according to the aspect of the invention, when a vibration mode in which the longitudinal vibration mode and the bending vibration mode are combined is generated in response to an applied voltage, each of the first frictional portion and the second frictional portion performs an elliptical motion. The first frictional portion and the second frictional portion have a large driving force in an accelerating part of the elliptical motion (a longitudinal component of an ellipse). In the piezoelectric actuator, the antinodes of the piezoelectric element are located at positions which are asymmetric with respect to a straight line passing through the center in the longitudinal direction of the piezoelectric element and parallel to the facing direction of the pair of principal surfaces when viewed in the facing direction of the pair of lateral surfaces. In the piezoelectric actuator, the first frictional portion is disposed at a position other than the antinodes of the piezoelectric element at which a distance from one end surface is less than ⅓ L, and the second frictional portion is disposed at a position other than the antinodes of the piezoelectric element at which a distance from the other end surface is less than ⅓ L. By employing this configuration, in the piezoelectric actuator, a longitudinal component of an ellipse can be caused to lean such that the longitudinal component of the ellipse is parallel to the longitudinal direction of the piezoelectric element in the elliptical motion of the first frictional portion and the second frictional portion (an angle formed by the longitudinal component of the ellipse and the longitudinal direction of the piezoelectric element can be reduced). Accordingly, in the piezoelectric actuator, the first frictional portion and the second frictional portion come into contact with the driven object in an accelerating part of the elliptical motion. Accordingly, it is possible to secure a driving force in the piezoelectric actuator. As a result, it is possible to achieve an improvement in driving characteristics of the piezoelectric actuator.

In one embodiment, the piezoelectric element may include four first internal electrodes that are disposed on the same piezoelectric material layer and a second internal electrode that is disposed to face the four first internal electrodes with the piezoelectric material layer interposed therebetween, a voltage being applied between the second internal electrode and the first internal electrodes, two first internal electrodes of the four first internal electrodes may be located at positions on a first diagonal line and the other two first internal electrodes may be located at positions on a second diagonal line crossing the first diagonal line, and two of the first internal electrodes located on the first diagonal line or the second diagonal line may be electrically connected to each other via a connection member. In the piezoelectric element, displacement is caused in parts (regions) having a maximum dimension in the internal electrodes. In the piezoelectric actuator according to the one embodiment, since the two first internal electrodes which are located on the first diagonal line or the second diagonal line on the piezoelectric material layer are electrically connected to each other via the connection member, displacement is caused over the two first internal electrodes connected to each other via the connection member. On the other hand, displacement is caused in parts having a maximum dimension in the other two first internal electrodes. In this way, a displacement difference is caused on the same piezoelectric material layer. According to this configuration, in the piezoelectric actuator, antinodes of the piezoelectric element can be set to positions which are asymmetric with respect to a straight line passing through the center in the longitudinal direction of the piezoelectric element and parallel to the facing direction of the pair of principal surfaces when viewed in the facing direction of the pair of lateral surfaces.

According to the aspect of the invention, it is possible to achieve an improvement in driving characteristics of the piezoelectric actuator.

DETAILED DESCRIPTION

Hereinafter, an exemplary embodiment of the invention will be described in detail with reference to the accompanying drawings. In description with reference to the drawings, the same or corresponding elements will be referenced by the same reference signs and description thereof will not be repeated.

Figure 1:
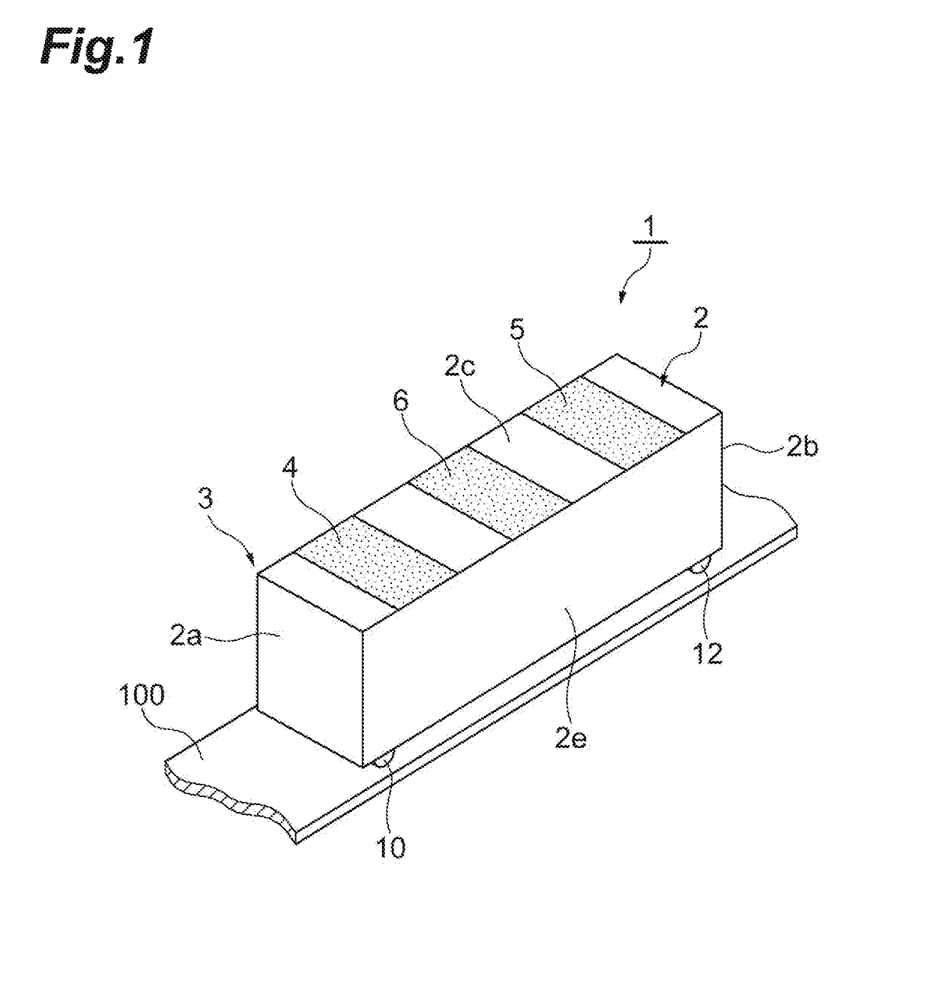
FIG. 1 is a perspective view illustrating a state in which a piezoelectric actuator according to an embodiment is mounted in a driven object.
Figure 2A:
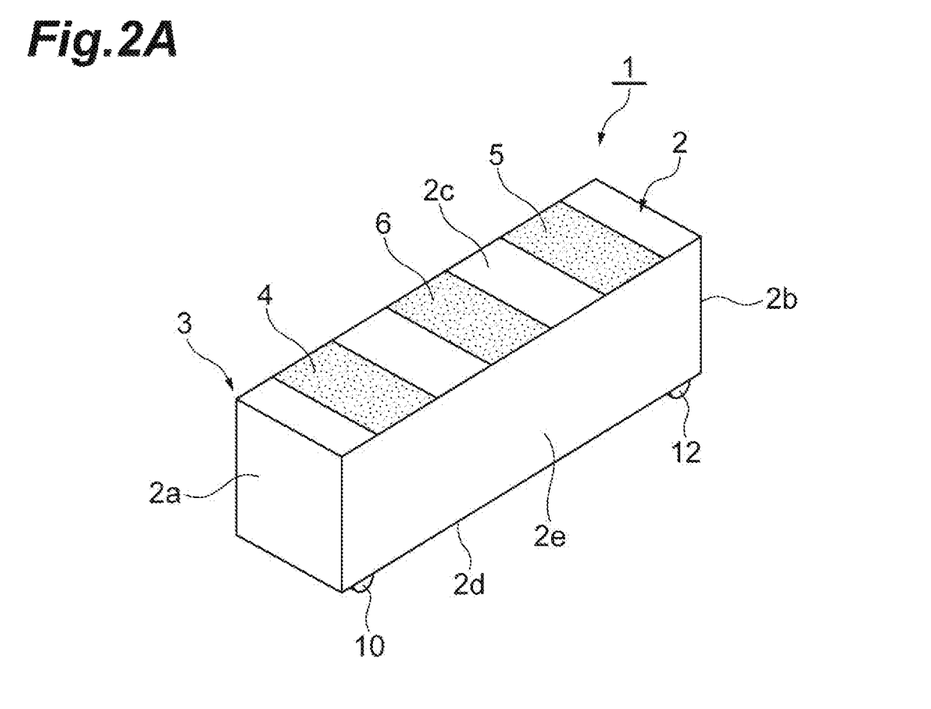
FIGS. 2A and 2B are perspective views illustrating the piezoelectric actuator.
Figure 2B:
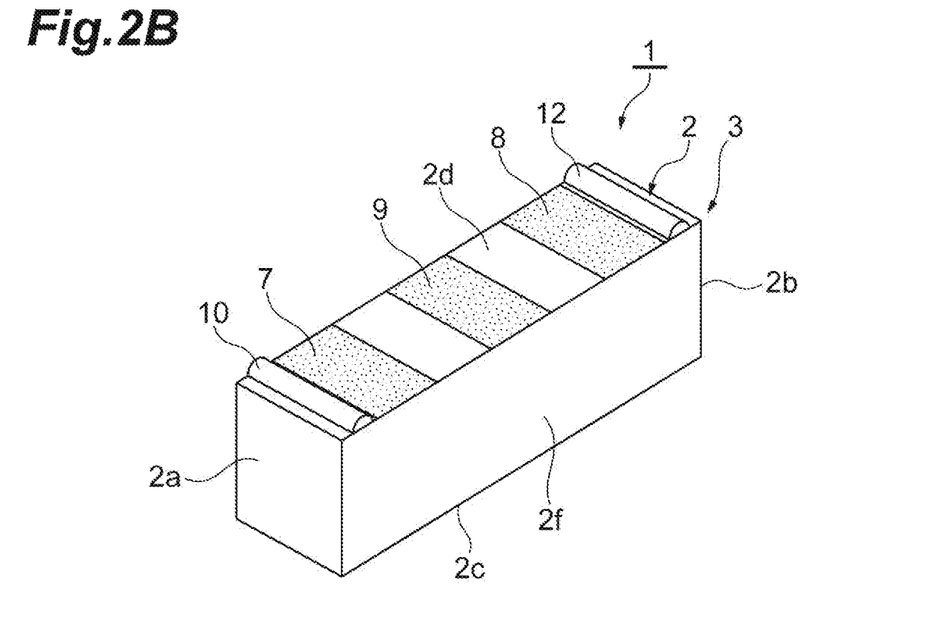

As illustrated in FIG. 1, a piezoelectric actuator 1 has a function of moving a driven object 100 (for example, a rotor) by displacement responsive to an applied AC voltage. As illustrated in FIGS. 1, 2A, and 2B, the piezoelectric actuator 1 includes a piezoelectric element 3, a first frictional portion 10, and a second frictional portion 12. The driven object 100 is moved by frictional forces from the first frictional portion 10 and the second frictional portion 12.

A stacked body 2 of the piezoelectric element 3 has a rectangular parallelepiped shape. The stacked body 2 includes a pair of end surfaces 2a and 2b facing each other, a pair of principal surfaces 2c and 2d facing each other, and a pair of lateral surfaces 2e and 2f facing each other. The principal surfaces 2c and 2d have rectangular shapes. In this embodiment, the facing direction of the pair of end surfaces 2a and 2b which face each other in a long-side direction of the pair of principal surfaces 2c and 2d is defined as a longitudinal direction of the stacked body 2 (the piezoelectric element 3). The facing direction of the pair of principal surfaces 2c and 2d is defined as a height direction of the stacked body 2 (the piezoelectric element 3). The facing direction of the pair of lateral surfaces 2e and 2f facing in a short-side direction of the pair of principal surfaces 2c and 2d is defined as a width direction of the stacked body 2 (the piezoelectric element 3).

The pair of end surfaces 2a and 2b extend to connect the principal surfaces 2c and 2d. The pair of end surfaces 2a and 2b extend in the short-side direction of the pair of principal surfaces 2c and 2d. The pair of lateral surfaces 2e and 2f extend to connect the principal surfaces 2c and 2d. The pair of lateral surfaces 2e and 2f extend in the long-side direction of the pair of principal surfaces 2c and 2d. In this embodiment, as illustrated in FIG. 1, the principal surface 2d is defined as a mounting surface facing the driven object 100 when the piezoelectric actuator is mounted on the driven object 100.

The stacked body 2 is formed of a piezoelectric ceramic material. Examples of the piezoelectric ceramic material include PZT [Pb(Zr,Ti)$O_3$], PT (PbTi$O_3$), PLZT [(Pb,La)(Zr,Ti)$O_3$], and barium titanate (BaTi$O_3$). In this embodiment, the stacked body 2 is formed by stacking piezoelectric material layers 20a to 20f (see FIG. 3) which are sintered bodies of ceramic green sheets including the piezoelectric ceramic material. In the stacked body 2, the stacking direction of a plurality of piezoelectric material layers 20a to 20f is parallel to the facing direction of the pair of lateral surfaces 2e and 2f. In the actual stacked body 2, the piezoelectric material layers 20a to 20f are integrated to such an extent that boundaries between the piezoelectric material layers 20a to 20f cannot be visually recognized. In this embodiment, an outer surface of the piezoelectric material layer 20a constitutes the lateral surface 2f of the stacked body 2, and an outer surface of the piezoelectric material layer 20f constitutes the lateral surface 2e of the stacked body 2.

Figure 3:
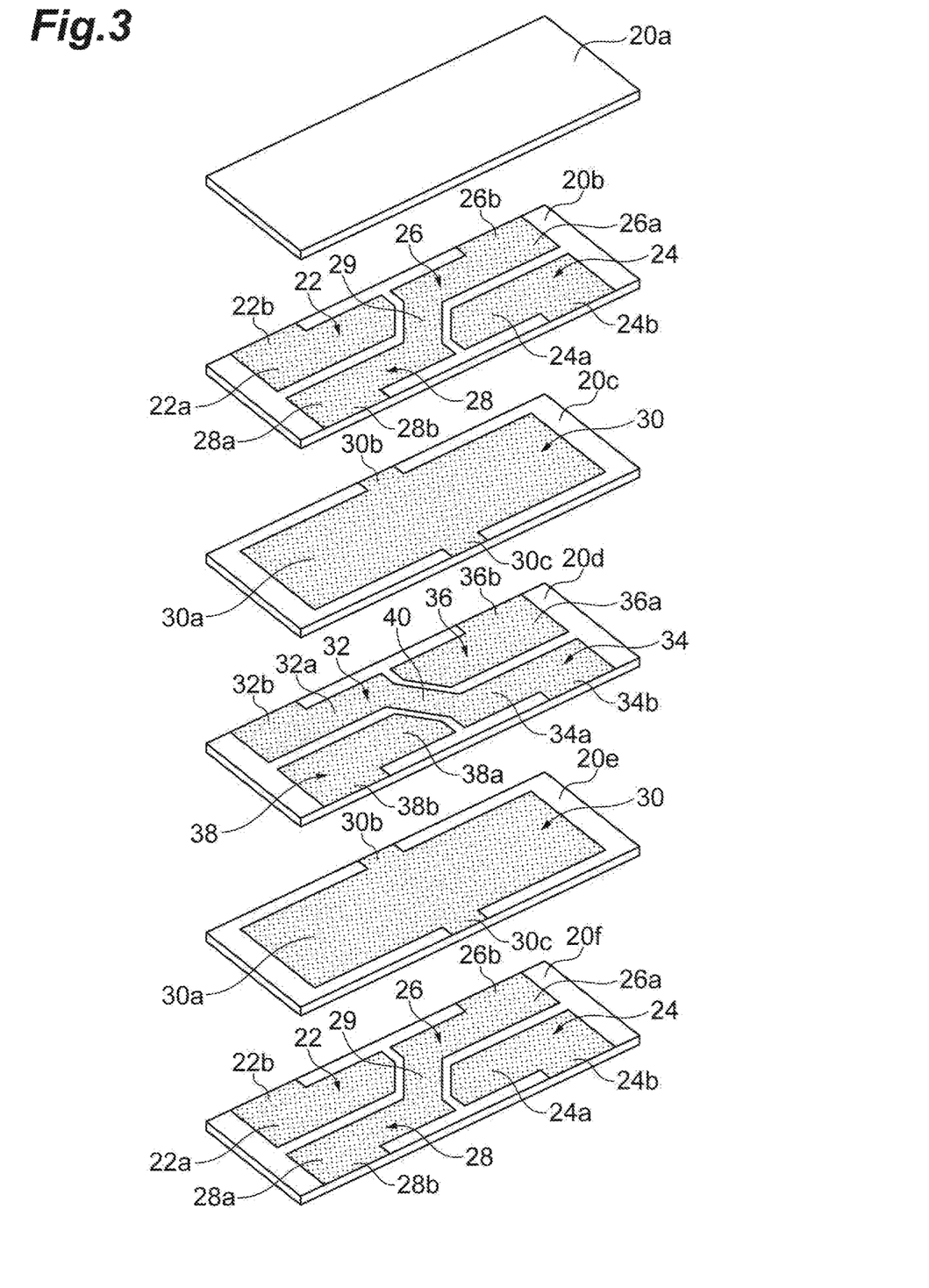
FIG. 3 is an exploded perspective view of a piezoelectric element.

As illustrated in FIG. 3, the piezoelectric element 3 includes a first internal electrode 22, a second internal electrode 24, a third internal electrode 26, a fourth internal electrode 28, a fifth internal electrode 30, a sixth internal electrode 32, a seventh internal electrode 34, an eighth internal electrode 36, and a ninth internal electrode 38. The internal electrodes 22, 24, 26, 28, 30, 32, 34, 36, and 38 are formed of a conductive material that is generally used as an internal electrode of a stacked type electronic element (for example, Ni, Pt, or Pd). The internal electrodes 22, 24, 26, 28, 30, 32, 34, 36, and 38 are formed as sintered bodies of a conductive paste including the conductive material. The first internal electrode 22, the second internal electrode 24, the third internal electrode 26, and the fourth internal electrode 28 constitute four first internal electrodes which are described in the claims. The fifth internal electrode 30 constitutes the second internal electrode which is described in the claims. The sixth internal electrode 32, the seventh internal electrode 34, the eighth internal electrode 36, and the ninth internal electrode 38 constitute four first internal electrodes which are described in the claims.

The first internal electrode 22, the second internal electrode 24, the third internal electrode 26, and the fourth internal electrode 28 are disposed on the piezoelectric material layer 20b. The first internal electrode 22 and the second internal electrode 24 are electrically isolated (separated) from each other on the piezoelectric material layer 20b. The third internal electrode 26 and the fourth internal electrode 28 are electrically connected to each other on the piezoelectric material layer 20b.

The first internal electrode 22 is disposed on the side of a corner which is formed by the end surface 2a and the principal surface 2c of the stacked body 2 on the piezoelectric material layer 20b. The first internal electrode 22 includes a main electrode portion 22a and a connecting portion 22b. The main electrode portion 22a and the connecting portion 22b are integrally formed. The connecting portion 22b extends from the main electrode portion 22a to one principal surface 2c of the stacked body 2 and is exposed from the principal surface 2c of the stacked body 2. Specifically, the connecting portion 22b is exposed from the principal surface 2c at a position in the vicinity of one end surface 2a of the stacked body 2.

The second internal electrode 24 is disposed on the side of a corner which is on the same diagonal line (a first diagonal line) as the corner at which the first internal electrode 22 is disposed, that is, a corner which is formed by the end surface 2b and the principal surface 2d of the stacked body 2, on the piezoelectric material layer 20b. The second internal electrode 24 includes a main electrode portion 24a and a connecting portion 24b. The main electrode portion 24a and the connecting portion 24b are integrally formed. The connecting portion 24b extends from the main electrode portion 24a to one principal surface 2d of the stacked body 2 and is exposed from the principal surface 2d of the stacked body 2. Specifically, the connecting portion 24b is exposed from the principal surface 2d at a position in the vicinity of the other end surface 2b of the stacked body 2.

The third internal electrode 26 is disposed on the side of a corner which is formed by the end surface 2b and the principal surface 2c of the stacked body 2 on the piezoelectric material layer 20b. The third internal electrode 26 includes a main electrode portion 26a and a connecting portion 26b. The main electrode portion 26a and the connecting portion 26b are integrally formed. The connecting portion 26b extends from the main electrode portion 26a to one principal surface 2c of the stacked body 2 and is exposed from the principal surface 2c of the stacked body 2. Specifically, the connecting portion 26b is exposed from the principal surface 2c at a position in the vicinity of the other end surface 2b of the stacked body 2.

The fourth internal electrode 28 is disposed on the side of a corner which is on the same diagonal line (a second diagonal line) as the corner at which the third internal electrode 26 is disposed, that is, a corner which is formed by the end surface 2a and the principal surface 2d of the stacked body 2, on the piezoelectric material layer 20b. The fourth internal electrode 28 includes a main electrode portion 28a and a connecting portion 28b. The main electrode portion 28a and the connecting portion 28b are integrally formed. The connecting portion 28b extends from the main electrode portion 28a to one principal surface 2d of the stacked body 2 and is exposed from the principal surface 2d of the stacked body 2. Specifically, the connecting portion 28b is exposed from the principal surface 2d at a position in the vicinity of the one end surface 2a of the stacked body 2.

The third internal electrode 26 and the fourth internal electrode 28 are electrically connected to each other by a connection member 29. Specifically, the main electrode portion 26a of the third internal electrode 26 and the main electrode portion 28a of the fourth internal electrode 28 are electrically connected to each other via the connection member 29. The connection member 29 is disposed between the first internal electrode 22 and the second internal electrode 24 which are disposed on the diagonal line with a predetermined gap therebetween. The connection member 29 is formed of a conductive material (for example, Ni, Pt, or Pd). The connection member 29 is formed as a sintered body of a conductive paste including the conductive material.

The fifth internal electrode 30 is disposed on the piezoelectric material layer 20c. The fifth internal electrode 30 includes a main electrode portion 30a and connecting portions 30b and 30c. The main electrode portion 30a has a rectangular shape with the longitudinal direction of the stacked body 2 as a longitudinal direction of the main electrode portion 30a. The main electrode portion 30a faces the first internal electrode 22 (the main electrode portion 22a), the second internal electrode 24 (the main electrode portion 24a), the third internal electrode 26 (the main electrode portion 26a), and the fourth internal electrode 28 (the main electrode portion 28a) with the piezoelectric material layer 20b interposed therebetween.

The connecting portion 30b extends from one lateral surface in the longitudinal direction of the main electrode portion 30a to one principal surface 2c of the stacked body 2 and is exposed from the principal surface 2c of the stacked body 2. Specifically, the connecting portion 30b is exposed from the principal surface 2c at a position of the center in the longitudinal direction of the stacked body 2. The connecting portion 30c extends from the other lateral surface in the longitudinal direction of the main electrode portion 30a to the other principal surface 2d of the stacked body 2 and is exposed from the principal surface 2d of the stacked body 2. Specifically, the connecting portion 30c is exposed from the principal surface 2d at a position of the center in the longitudinal direction of the stacked body 2.

The sixth internal electrode 32, the seventh internal electrode 34, the eighth internal electrode 36, and the ninth internal electrode 38 are disposed on the piezoelectric material layer 20d. The sixth internal electrode 32 and the seventh internal electrode 34 are electrically connected to each other on the piezoelectric material layer 20d. The eighth internal electrode 36 and the ninth internal electrode 38 are electrically isolated from each other on the piezoelectric material layer 20d.

The sixth internal electrode 32 is disposed on the side of a corner which is formed by the end surface 2a and the principal surface 2c of the stacked body 2 on the piezoelectric material layer 20d. The sixth internal electrode 32 includes a main electrode portion 32a and a connecting portion 32b. The main electrode portion 32a and the connecting portion 32b are integrally formed. The connecting portion 32b extends from the main electrode portion 32a to one principal surface 2c of the stacked body 2 and is exposed from the principal surface 2c of the stacked body 2. Specifically, the connecting portion 32b is exposed from the principal surface 2c at a position in the vicinity of one end surface 2a of the stacked body 2.

The seventh internal electrode 34 is disposed on the side of a corner which is on the same diagonal line as the corner at which the sixth internal electrode 32 is disposed, that is, a corner which is formed by the end surface 2b and the principal surface 2d of the stacked body 2, on the piezoelectric material layer 20d. The seventh internal electrode 34 includes a main electrode portion 34a and a connecting portion 34b. The main electrode portion 34a and the connecting portion 34b are integrally formed. The connecting portion 34b extends from the main electrode portion 34a to one principal surface 2d of the stacked body 2 and is exposed from the principal surface 2d of the stacked body 2. Specifically, the connecting portion 34b is exposed from the principal surface 2d at a position in the vicinity of the other end surface 2b of the stacked body 2.

The eighth internal electrode 36 is disposed on the side of a corner which is formed by the end surface 2b and the principal surface 2c of the stacked body 2 on the piezoelectric material layer 20d. The eighth internal electrode 36 includes a main electrode portion 36a and a connecting portion 36b. The main electrode portion 36a and the connecting portion 36b are integrally formed. The connecting portion 36b extends from the main electrode portion 36a to one principal surface 2c of the stacked body 2 and is exposed from the principal surface 2c of the stacked body 2. Specifically, the connecting portion 36b is exposed from the principal surface 2c at a position in the vicinity of the other end surface 2b of the stacked body 2.

The ninth internal electrode 38 is disposed on the side of a corner which is on the same diagonal line as the corner at which the eighth internal electrode 36 is disposed, that is, a corner which is formed by the end surface 2a and the principal surface 2d of the stacked body 2, on the piezoelectric material layer 20d. The ninth internal electrode 38 includes a main electrode portion 38a and a connecting portion 38b. The main electrode portion 38a and the connecting portion 38b are integrally formed. The connecting portion 38b extends from the main electrode portion 38a to one principal surface 2d of the stacked body 2 and is exposed from the principal surface 2d of the stacked body 2. Specifically, the connecting portion 38b is exposed from the principal surface 2d at a position in the vicinity of the other end surface 2a of the stacked body 2.

The sixth internal electrode 32 and the seventh internal electrode 34 are electrically connected to each other by a connection member 40. Specifically, the main electrode portion 32a of the sixth internal electrode 32 and the main electrode portion 34a of the seventh internal electrode 34 are electrically connected to each other via the connection member 40. The connection member 40 is disposed between the eighth internal electrode 36 and the ninth internal electrode 38 which are disposed on the diagonal line with a predetermined gap therebetween.

The fifth internal electrode 30 is disposed on the piezoelectric material layer 20e. The first internal electrode 22 the second internal electrode 24, the third internal electrode 26, and the fourth internal electrode 28 are disposed on the piezoelectric material layer 20f. The third internal electrode 26 and the fourth internal electrode 28 are electrically connected to each other via the connection member 29.

As illustrated in FIGS. 2A and 2B, the piezoelectric element 3 includes a first external electrode 4, a second external electrode 5, a third external electrode 6, a fourth external electrode 7, a fifth external electrode 8, and a sixth external electrode 9. As illustrated in FIGS. 1 and 2A, the first external electrode 4 is disposed on one principal surface 2c of the stacked body 2. Specifically, the first external electrode 4 is disposed on the side of one end surface 2a on the principal surface 2c. The first external electrode 4 has a rectangular shape. In this embodiment, the first external electrode 4 is formed from one lateral surface 2e to the other lateral surface 2f. The first external electrode 4 is directly connected to the connecting portion 22b and the connecting portion 32b which are exposed from the principal surface 2c. Accordingly, the first external electrode 4 is electrically connected to the first internal electrode 22 and the sixth internal electrode 32.

The first external electrode 4 is formed by applying a conductive paste to the principal surface 2c of the stacked body 2 and then baking the resultant structure at a predetermined temperature (for example, about 700° C.). A baked electrode layer obtained by baking the conductive paste may be electroplated to additionally form a plated layer thereon. A conductive paste including a conductive material containing Ag as a main component can be used as the conductive paste. An example of the plated layer is a Ni/Au plated layer.

The first external electrode 4 may be formed using a sputtering method, a vapor deposition method, or the like. In this case, examples of a film structure constituting the first external electrode 4 include Cr/Ni, NiCu/Ag, SnAg, and Au. Thereafter, the second external electrode 5, the third external electrode 6, the fourth external electrode 7, the fifth external electrode 8, and the sixth external electrode 9 are formed in the same way as the first external electrode 4 is formed.

The second external electrode 5 is disposed on one principal surface 2c of the stacked body 2. Specifically, the second external electrode 5 is disposed on the side of the other end surface 2b on the principal surface 2c. The second external electrode 5 has a rectangular shape. In this embodiment, the second external electrode 5 is formed from one lateral surface 2e to the other lateral surface 2f. The second external electrode 5 is directly connected to the connecting portion 26b and the connecting portion 36b which are exposed from the principal surface 2c. Accordingly, the second external electrode 5 is electrically connected to the third internal electrode 26 and the eighth internal electrode 36.

The third external electrode 6 is disposed on one principal surface 2c of the stacked body 2. Specifically, the third external electrode 6 is disposed in a middle part in the longitudinal direction of the stacked body 2 on the principal surface 2c. That is, the third external electrode 6 is disposed between the first external electrode 4 and the second external electrode 5 in the longitudinal direction of the stacked body 2. The third external electrode 6 has a rectangular shape. In this embodiment, the third external electrode 6 is fainted from one lateral surface 2e to the other lateral surface 2f. The third external electrode 6 is directly connected to the connecting portion 30b which is exposed from the principal surface 2c. Accordingly, the third external electrode 6 is electrically connected to the fifth internal electrode 30.

As illustrated in FIG. 2B, the fourth external electrode 7 is disposed on the other principal surface 2d of the stacked body 2. Specifically, the fourth external electrode 7 is disposed on the side of one end surface 2a on the principal surface 2d. The fourth external electrode 7 is disposed at a position which faces the first external electrode 4 in the height direction of the stacked body 2. The fourth external electrode 7 has a rectangular shape. In this embodiment, the fourth external electrode 7 is formed from one lateral surface 2e to the other lateral surface 2f. The fourth external electrode 7 is directly connected to the connecting portion 28b and the connecting portion 38b which are exposed from the principal surface 2d. Accordingly, the fourth external electrode 7 is electrically connected to the fourth internal electrode 28 and the ninth internal electrode 38.

The fifth external electrode 8 is disposed on the other principal surface 2d of the stacked body 2. Specifically, the fifth external electrode 8 is disposed on the side of the other end surface 2b on the principal surface 2d. The fifth external electrode 8 is disposed at a position which faces the second external electrode 5 in the height direction of the stacked body 2. The fifth external electrode 8 has a rectangular shape. In this embodiment, the fifth external electrode 8 is formed from one lateral surface 2e to the other lateral surface 2f. The fifth external electrode 8 is directly connected to the connecting portion 24b and the connecting portion 34b which are exposed from the principal surface 2d. Accordingly, the fifth external electrode 8 is electrically connected to the second internal electrode 24 and the seventh internal electrode 34.

The sixth external electrode 9 is disposed on the other principal surface 2d of the stacked body 2. Specifically, the sixth external electrode 9 is disposed in the middle part in the longitudinal direction of the stacked body 2 on the principal surface 2d. That is, the sixth external electrode 9 is disposed between the fourth external electrode 7 and the fifth external electrode 8 in the longitudinal direction of the stacked body 2. The sixth external electrode 9 is disposed at a position which faces the third external electrode 6 in the height direction of the stacked body 2. The sixth external electrode 9 has a rectangular shape. In this embodiment, the sixth external electrode 9 is formed from one lateral surface 2e to the other lateral surface 2f. The sixth external electrode 9 is directly connected to the connecting portion 30c which is exposed from the principal surface 2d. Accordingly, the sixth external electrode 9 is electrically connected to the fifth internal electrode 30.

The first frictional portion 10 and the second frictional portion 12 are disposed on the principal surface 2d of the stacked body 2. The first frictional portion 10 and the second frictional portion 12 are formed of zirconia, alumina, or the like. The first frictional portion 10 and the second frictional portion 12 are provided by cutting a cylindrical member into a semicircular sectional shape and bonding the cut surfaces to two positions of the principal surface 2d. The first frictional portion 10 and the second frictional portion 12 are provided such that the extending direction of the semicircular column is parallel to the width direction of the stacked body 2.

Figure 4:
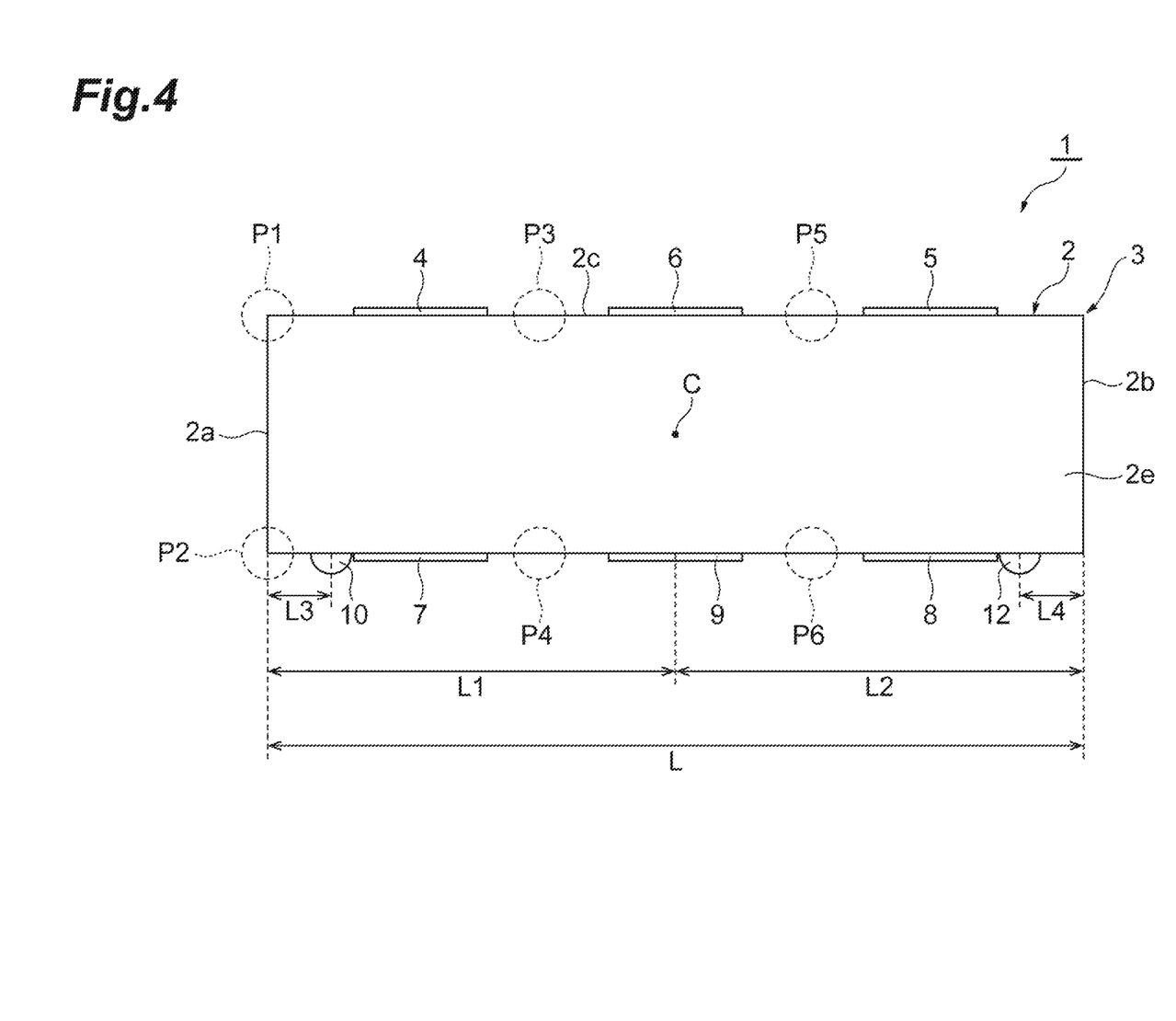
FIG. 4 is a side view of the piezoelectric actuator.

The first frictional portion 10 is disposed at a position other than antinodes P1 to P6 of the piezoelectric element 3 which will be described later at which a distance from one end surface 2a is less than ⅓ L where L represents a length in the longitudinal direction of the piezoelectric element 3. In this embodiment, as illustrated in FIG. 4, the first frictional portion 10 is disposed at a position at which the distance from one end surface 2a of the stacked body 2 is L3. L3 represents a position which is distant 1/12 L from the end surface 2a of the stacked body 2 where L represents the length in the longitudinal direction of the piezoelectric element 3. That is, when the length from the center C in the longitudinal direction of the piezoelectric element 3 to the end surface 2a is L1 (½ L), the first frictional portion 10 is disposed at a position which is distant ⅙ L1 from the end surface 2a of the stacked body 2. In this embodiment, the first frictional portion 10 is disposed at a position (a position which does not overlap the fourth external electrode 7) which is closer to the end surface 2a than the fourth external electrode 7.

The second frictional portion 12 is disposed at a position other than the antinodes P1 to P6 of the piezoelectric element 3 which will be described later at which a distance from the other end surface 2b is less than ⅓ L where L represents a length in the longitudinal direction of the piezoelectric element 3. In this embodiment, the second frictional portion 12 is disposed at a position at which the distance from the other end surface 2b of the stacked body 2 is L4. L4 represents a position which is distant 1/12 L from the end surface 2b of the stacked body 2. That is, when the length from the center C in the longitudinal direction of the piezoelectric element 3 to the end surface 2b is L2 (½ L), the second frictional portion 12 is disposed at a position which is distant ⅙ L2 from the end surface 2b of the stacked body 2. In this embodiment, the second frictional portion 12 is disposed at a position (a position which does not overlap the fifth external electrode 8) which is closer to the end surface 2b than the fifth external electrode 8.

Figure 5A:
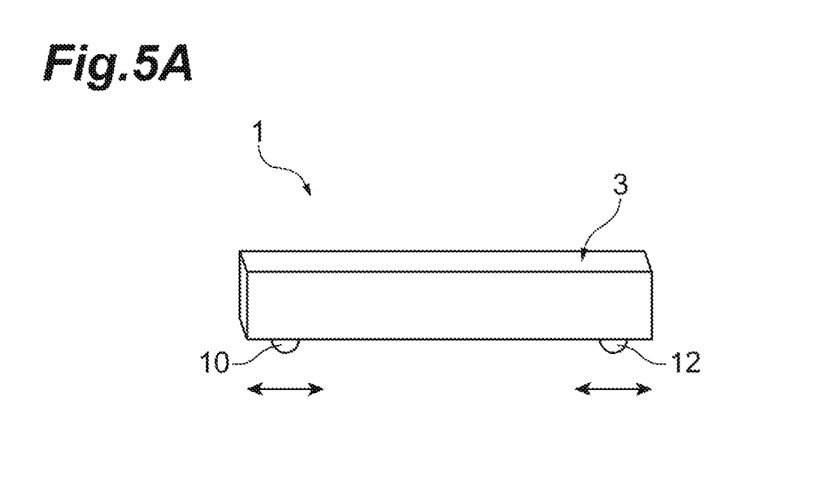
FIG. 5A is a diagram illustrating a longitudinal vibration mode and FIG. 5B is a diagram illustrating a bending vibration mode.
Figure 5B:
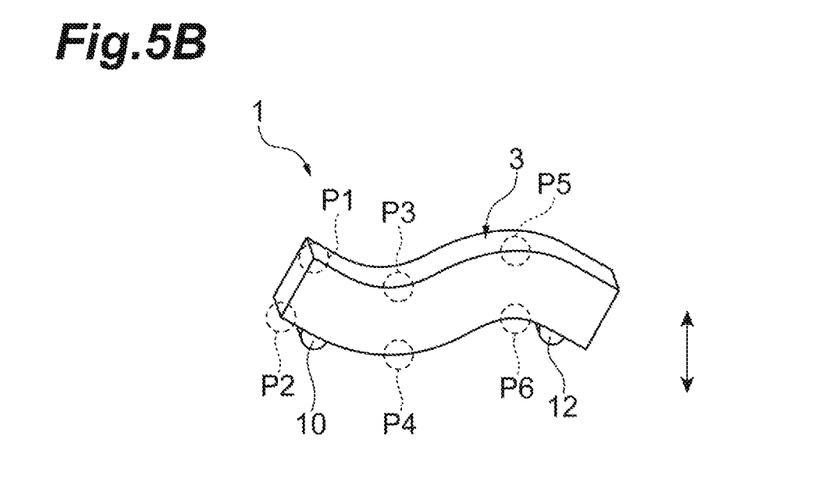

An operation of the piezoelectric actuator 1 having the above-mentioned configuration will be described below with reference to FIGS. 5A and 5B. The piezoelectric actuator 1 includes two resonance modes at the time of driving. Specifically, the piezoelectric actuator 1 vibrates in combination of a longitudinal vibration mode in which the piezoelectric actuator vibrates in the longitudinal direction of the piezoelectric element 3 as illustrated in FIG. 5A and a bending vibration mode in which the piezoelectric actuator vibrates in the height direction of the piezoelectric element 3 as illustrated I FIG. 5B.

In the piezoelectric actuator 1, the third external electrode and the sixth external electrode 9 are connected to the ground and voltages with a phase difference of 90° are applied across the first external electrode 4 and the sixth external electrode 9 and across the second external electrode 5 and the fifth external electrode 8 to drive the piezoelectric element 3, elliptical motions with a phase difference of 180° are caused in the first frictional portion 10 and the second frictional portion 12. Accordingly, a frictional force acts alternately between the first frictional portion 10 and the second frictional portion 12 and the driven object 100 (see FIG. 1) to move the driven object 100. The elliptical motions of the first frictional portion 10 and the second frictional portion 12 may have the same trace or may have different traces.

In this embodiment, the piezoelectric element 3 has antinodes of vibration (positions having maximum amplitude in the vibration) at positions which are asymmetric with respect to a straight line passing through the center C in the longitudinal direction of the piezoelectric element 3 and parallel to the height direction thereof when viewed in the width direction (the facing direction of the pair of lateral surfaces 2e and 2f of the stacked body 2). Specifically, as illustrated in FIG. 4, the antinodes of vibration of the piezoelectric element 3 are located, for example, at positions indicated by P1 to P6. In the piezoelectric actuator 1, the first to sixth external electrodes 4 to 9 are disposed at nodes of vibration (positions not having amplitude in the vibration) of the piezoelectric element 3.

The positions of the antinodes of vibration P1 to P6 are implemented by deviating a resonance frequency of the longitudinal vibration mode and a resonance frequency of the bending vibration mode from each other. The resonance frequency of the longitudinal vibration mode and the resonance frequency of the bending vibration mode are adjusted depending on a dimension ratio in the longitudinal direction and the width direction of the piezoelectric element 3. Accordingly, by adjusting the dimension ratio of the piezoelectric element 3, it is possible to deviate the resonance frequency of the longitudinal vibration mode and the resonance frequency of the bending vibration mode from each other.

The positions of the antinodes of vibration P1 to P6 are implemented by the configurations of the first to fourth internal electrodes 22 to 28 and the sixth to ninth internal electrodes 32 to 38. Specifically, in this embodiment, the third internal electrode 26 and the fourth internal electrode 28 on the piezoelectric material layer 20b and the piezoelectric material layer 20f are electrically connected to each other via the connection member 29, and the sixth internal electrode 32 and the seventh internal electrode 34 on the piezoelectric material layer 20d are electrically connected via the connection member 40. In the piezoelectric element 3, displacement is caused in parts (regions) having a maximum dimension in the internal electrodes. For example, since the third internal electrode 26 and the fourth internal electrode 28 on the piezoelectric material layer 20b are electrically connected to each other via the connection member 29, displacement is caused over the third internal electrode 26 and the fourth internal electrode 28 which are located on the diagonal line. On the other hand, in the first internal electrode 22 and the second internal electrode 24 which are diagonally separated, displacement is caused in the parts having a maximum dimension. In this way, a displacement difference is caused on the same piezoelectric material layer 20b. Accordingly, the antinodes of vibration P1 to P6 of the piezoelectric element 3 are asymmetric with respect to the straight line passing through the center C in the longitudinal direction of the piezoelectric element 3 and parallel to the height direction when viewed in the width direction of the piezoelectric element 3.

As described above, in the piezoelectric actuator 1 according to this embodiment, when a voltage is applied and a vibration mode in which the longitudinal vibration mode and the bending vibration mode are combined is generated, the first frictional portion 10 and the second frictional portion 12 perform elliptical motions. The first frictional portion 10 and the second frictional portion 12 acquire a large driving force in accelerating parts of the elliptical motions (longitudinal components of an ellipse).

In the piezoelectric actuator 1 according to this embodiment, the antinodes P1 to P6 of the piezoelectric element 3 are located at positions which are asymmetric with respect to the straight line passing through the center C in the longitudinal direction of the piezoelectric element 3 and parallel to the height direction when viewed in the width direction of the piezoelectric element 3. In the piezoelectric actuator 1, the first frictional portion 10 is disposed at the position other than antinodes P1 to P6 of the piezoelectric element 3 at which the distance from one end surface 2a is less than ⅓ L, and the second frictional portion 12 is disposed at the position other than antinodes P1 to P6 of the piezoelectric element 3 at which the distance from the other end surface 2b is less than ⅓ L. According to this configuration, in the elliptical motions of the first frictional portion 10 and the second frictional portion 12 in the piezoelectric actuator 1, the longitudinal components of the ellipse can be caused to lean (the angle which is formed by the longitudinal component of the ellipse and the longitudinal direction of the piezoelectric element 3 can be reduced) such that the longitudinal components of the ellipse is parallel to the longitudinal direction of the piezoelectric element 3. Accordingly, in the piezoelectric actuator 1, the first frictional portion 10 and the second frictional portion 12 come into contact with the driven object 100 in the accelerating parts of the elliptical motions. Accordingly, the piezoelectric actuator 1 can secure a driving force. As a result, with the piezoelectric actuator 1, it is possible to achieve an improvement in driving characteristics.

Figure 6A:
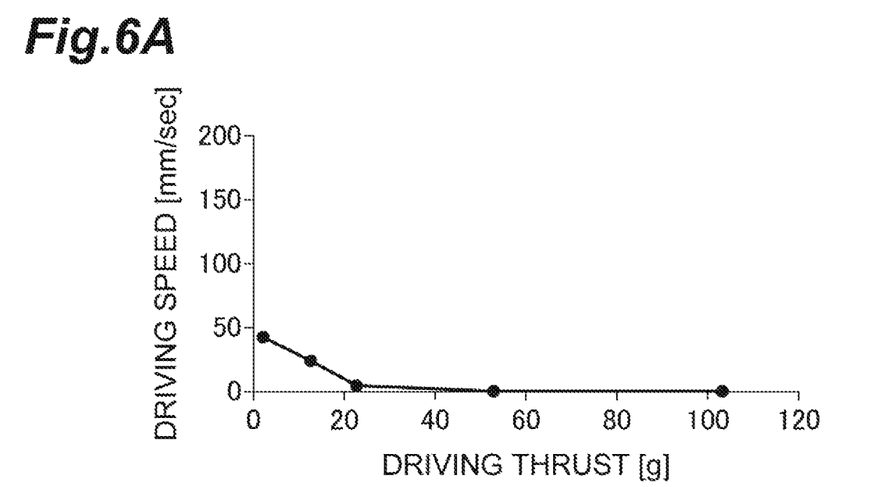
FIG. 6A is a diagram illustrating driving characteristics of a piezoelectric actuator according to the related art and FIG. 6B is a diagram illustrating driving characteristics of the piezoelectric actuator according to the embodiment.
Figure 6B:
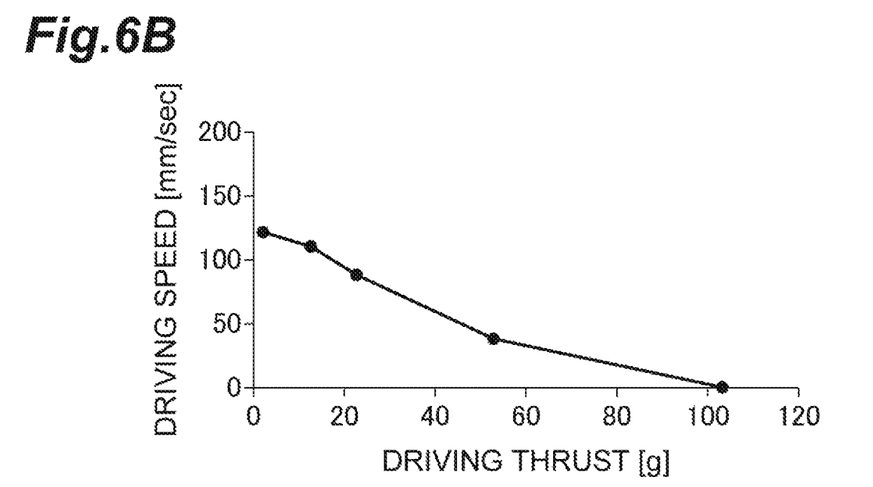

FIG. 6A is a diagram illustrating driving characteristics of a piezoelectric actuator according to the related art, and FIG. 6B is a diagram illustrating driving characteristics of the piezoelectric actuator according to this embodiment. In FIGS. 6A and 6B, the horizontal axis represents a driving thrust [g], and the vertical axis represents a driving speed [mm/sec].

In the piezoelectric actuator according to the related art illustrated in FIG. 6A, when the length in the longitudinal direction of the piezoelectric element is defined as L, the center position (½ L) in the longitudinal direction, the position which is distant ⅙ L from one end in the longitudinal direction, and a position which is distant ⅙ L from the other end in the longitudinal direction are set to nodes, and one and the other end in the longitudinal direction, a position which is distant ⅓ L from one end in the longitudinal direction, and a position which is distance ⅓ L from the other end in the longitudinal direction are set to antinodes. In the piezoelectric actuator according to the related art illustrated in FIG. 6A, two frictional portions are disposed at a position which is distant ⅓ L from one end in the longitudinal direction and a position which is distant ⅓ L from the other end in the longitudinal direction.

As illustrated in FIGS. 6A and 6B, both the driving thrust and the driving speed in the piezoelectric actuator 1 according to this embodiment are improved in comparison with the piezoelectric actuator according to the related art. That is, in the piezoelectric actuator 1 according to this embodiment, by setting the antinodes P1 to P6 of the piezoelectric element 3 to the positions which are asymmetric with respect to the straight line passing through the center C in the longitudinal direction of the piezoelectric element 3 and parallel to the height direction when viewed in the width direction of the piezoelectric element 3, disposing the first frictional portion 10 at the position other than the antinodes P1 to P6 of the piezoelectric element 3 at which the distance from one end surface 2a is less than ⅓ L, and disposing the second frictional portion 12 at the position other than the antinodes P1 to P6 of the piezoelectric element 3 at which the distance from the other end surface 2b is less than ⅓ L, it is possible to achieve an improvement in driving characteristics in comparison with the configuration in which the frictional portions are disposed at the positions of the antinodes of vibration.

While an embodiment of the invention has been described above, the invention is not limited to the embodiment and can be modified in various forms without departing from the gist of the invention.

In the above-mentioned embodiment, the first to third external electrodes 4 to 6 having a rectangular shape are disposed on the principal surface 2c of the stacked body 2, and the fourth to sixth external electrodes 7 to 9 having a rectangular shape are disposed on the principal surface 2d of the stacked body 2. However, the configuration of the external electrodes is not limited thereto.

In the above-mentioned embodiment, the stacked body 2 is formed by stacking the piezoelectric material layers 20a to 20f. However, the number of piezoelectric material layers which are stacked is not limited thereto and can be appropriately set depending on a design.

In the above-mentioned embodiment, the first to ninth internal electrodes 22 to 38 having the configurations (shapes) illustrated in FIG. 3 are employed. However, the configurations of the internal electrodes are not limited thereto. The internal electrodes may have any configuration as long as the piezoelectric element 3 has antinodes having maximum amplitude in the bending vibration mode at the positions which are asymmetric with respect to the straight line passing through the center C in the longitudinal direction of the piezoelectric element 3 and parallel to the facing direction of a pair of principal surfaces 2c and 2d when viewed in the facing direction of a pair of lateral surfaces 2e and 2f of the stacked body 2.

In the above-mentioned embodiment, the first frictional portion 10 and the second frictional portion 12 are provided. However, another frictional portion may be additionally provided (three or more).

In the above-mentioned embodiment, the first frictional portion 10 is located at the position at which the distance from the end surface 2a of the stacked body 2 is 1/12 L where L represents the length in the longitudinal direction of the piezoelectric element 3. However, the first frictional portion has only to be located at a position at which the distance from one end surface 2a is less than ⅓ L where L represents the length in the longitudinal direction of the piezoelectric element 3. The same is true of the second frictional portion.

In the above-mentioned embodiment, the frictional portion 10 extends continuously in the width direction of the stacked body 2 on the principal surface 2d of the stacked body 2 of the piezoelectric element 3. However, the first frictional portion may be disposed intermittently in the width direction of the stacked body. The sectional shape of the first frictional portion is not limited to a semicircular shape. The first frictional portion may have a cylindrical shape or a semispherical shape. The same is true of the second frictional portion.

What is claimed is:
1. A piezoelectric actuator comprising:
a piezoelectric element that is composed of a stack of a plurality of piezoelectric material layers and generates a vibration mode in which a longitudinal vibration mode and a bending vibration mode are combined in response to an applied voltage, the piezoelectric element including:
a pair of principal surfaces having rectangular shapes and facing each other, the pair of principal surfaces being located in a direction orthogonal to a stacking direction of the plurality of piezoelectric material layers;

a pair of end surfaces facing each other in a long-side direction of the pair of principal surfaces;

a pair of lateral surfaces facing each other in a short-side direction of the pair of principal surfaces and in the stacking direction; and antinodes having maximum amplitude in the bending vibration mode at positions which are asymmetric with respect to a straight line passing through a center in a longitudinal direction of the piezoelectric element and parallel to a facing direction of the pair of principal surfaces when viewed in a facing direction of the pair of lateral surfaces;

a first frictional portion disposed on one of the pair of principal surfaces and configured to contact a driven object to generate frictional force with the driven object, the first frictional portion being disposed at a position other than the antinodes of the piezoelectric element at which a distance from one of the end surfaces is less than $\frac{1}{3}$ L, where L represents a length in the longitudinal direction of the piezoelectric element; and a second frictional portion disposed on the one of the pair of principal surfaces and configured to contact the driven object to generate frictional force with the driven object, the second frictional portion being disposed at a position other than the antinodes of the piezoelectric element at which a distance from the other of the end surfaces is less than $\frac{1}{3}$ L, wherein the first frictional portion and the second frictional portion are not part of a same structure.

2. The piezoelectric actuator according to claim 1, wherein the piezoelectric element includes four first internal electrodes that are disposed on one of the plurality of piezoelectric material layers and a second internal electrode that is disposed to face the four first internal electrodes with the one of the plurality of piezoelectric material layers interposed therebetween, a voltage to be applied between the second internal electrode and the four first internal electrodes, two first internal electrodes of the four first internal electrodes are located at positions on a first diagonal line and the other two first internal electrodes are located at positions on a second diagonal line crossing the first diagonal line, and the two first internal electrodes located on the first diagonal line or the second diagonal line are electrically connected to each other via a connection member.

* * * * *